United States Patent [19]

Kasano et al.

[11] 3,839,082

[45] Oct. 1, 1974

[54] EPITAXIAL GROWTH PROCESS FOR III-V MIXED-COMPOUND SEMICONDUCTOR CRYSTALS

[75] Inventors: Hiroyuki Kasano, Akishima; Kazuhiro Kurata, Hachioji, both of Japan

[73] Assignee: Hitachi, Ltd., Tokyo, Japan

[22] Filed: May 31, 1972

[21] Appl. No.: 258,175

[30] Foreign Application Priority Data

June 1, 1971 Japan .............................. 46-37483

[52] U.S. Cl. .............. 117/201, 117/5.5, 117/106 A, 148/175

[51] Int. Cl. .......................... B44d 1/18, H01l 7/36

[58] Field of Search ................ 117/201, 106 A, 5.5; 148/175

[56] References Cited

UNITED STATES PATENTS

| | | | |
|---|---|---|---|
| 3,345,209 | 10/1967 | Cheroff | 117/106 A |
| 3,447,976 | 6/1969 | Faust | 117/201 |
| 3,556,875 | 1/1971 | Holloway | 117/106 A |
| 3,660,180 | 5/1972 | Wajda | 117/106 A |
| 3,663,319 | 5/1972 | Rose | 148/175 |
| 3,705,059 | 12/1972 | Kur | 117/106 A |
| 3,723,201 | 3/1973 | Keil | 148/175 |

OTHER PUBLICATIONS

Lawley, Vapor Growth Parameters . . . Vapor Process, Vol. 113, No. 3, (1966) pg. 240–245, J. Electro Chem. Society.

Gupta, Silicon Epitaxial Layers . . . Profiles, J. Electro Chem. Soc. Vol. 116, No. 11, pg. 1561–65.

Doo et al., Growing High Resistivity . . . Substrates, IBM Tech. Disclosure, Vol. 5, No. 2 (7–1962) pg. 50–51.

Jolce, Epitaxial Growth of Si ... Substrates, J. Electro. Chem. Society (12–1963) Vol. 110, No. 12, pg. 1235–40.

*Primary Examiner*—Leon D. Rosdol
*Assistant Examiner*—Michael F. Esposito
*Attorney, Agent, or Firm*—Craig & Antonelli

[57] ABSTRACT

A process for epitaxially growing a III–V mixed-compound semiconductor crystal composed of three or more components on a semiconductor substrate made of a different material from the crystal utilizes a disproportionation reaction in a halogen vapor transport. The back and side faces of the substrate are covered with a material chemically stable against halogen or halides at the epitaxial temperature of the mixed crystal, and a compound, selected from among the crystal-composing compounds which has a relatively low epitaxial temperature, is epitaxially grown on the substrate maintained at said temperature. The temperature of the substrate is then increased to the epitaxial temperature of the crystal, and epitaxial growth of the crystal is carried out on the compound.

24 Claims, 2 Drawing Figures

EPITAXIAL GROWTH PROCESS FOR III-V MIXED-COMPOUND SEMICONDUCTOR CRYSTALS

BACKGROUND OF THE INVENTION

1. Field of the Invention

The present invention relates to a process for so-called hetero-epitaxy, or a process for epitaxially growing a III–V mixed-compound semiconductor crystal on a substrate made of a semiconductor material different from the crystal.

2. Description of the Prior Art

In general, in processes for the manufacture of semiconductor devices using crystals of III–V compounds grown on a semiconductor substrate made of a material other than III–V compounds, by utilizing a disproportionation reaction in a halogen vapor transport, one of the most perplexing problems encountered, even when using a substrate crystal having a lattice constant relatively close to that of the crystals to be grown is that the grown layer is autodoped with the substrate-composing elements in the course of growth, and thus, the characteristics of the semiconductor devices are degradated.

In order to control such autodoping, the inventors have already proposed, in Japanese Patent Application No. 45-25276, to cover the back and side faces of the substrate with a metallurgically and chemically stable material and also, in Japanese Patent Application No. 45-57776, to cover the upper surface of the substrate with a low vapor pressure material selected from the composing elements of the III–V compound grown layer. However, according to the method proposed in the latter application, although it has an excellent effect in controlling autodoping, it is also accompanied by the drawback that stability in the crystal growth is greatly influenced by the growing conditions, since this method utilizes a low fusing point alloy layer formed between the substrate surface and the growing layer and, hence, this proposal had the problem of poor reproducibility. On the other hand, according to the method in the former application, where the back and side faces of the base are coated, although it has proven useful in many applications, it still has the shortcoming that, in case the substrate temperature is relatively high, etching may occur on the front surface layer, before the base surface is covered with a III-V compound crystal and, consequently, autodoping would result.

As an improvement of the method described in the above-said Application No. 45-25276, the inventors have also proposed in Japanese Patent Application No. 45-114171 a new technique of using a second source material by which a non-reacting hydrogen halide is absorbed before it reaches the substrate, to thereby prevent autodoping. This new technique has almost solved the problem of autodoping of the substrate composing elements, but there have still been left unsolved some obstinate problems such as those mentioned below. Namely, in the situation where the reaction system has not yet reached perfect equilibrium, or in case the substrate is at a fairly high temperature, etching can still take place to some extent on the substrate, to consequently cause autodoping. Also, at the interfaces of the hetero-junction, lattice mis-matching or other metallurgical troubles (such as generation of an alloy layer) would cause degradation of the crystallinity of the grown layer.

SUMMARY OF THE INVENTION

The present invention, then, aims at perfectly solving the above-said problems particularly in the hetero-epitaxy of mixed crystals of III–V compounds. The basic principle of the invention is to continuously carry out double hetero-epitaxial growths at different epitaxy temperatures.

Generally, the epitaxial temperature of a mixed crystal $A_xB_{1-x}$ (where $x$ is the mixing ratio and $0<x<1$) stays midway between the epitaxial temperature of the crystal B, which is usually low, and that of the crystal A, which is high. For instance, the epitaxial temperature of $GaP_xAs_{1-x}$, which is a mixed crystal of GaAs and GaP, may be considered as lying midway between the low epitaxial temperature of GaAs and high epitaxial temperature of GaP.

The present invention makes the best use of the above characteristics. More specifically, according to the present invention, a crystal B is first epitaxially grown at low temperature on a semiconductor substrate to thinly cover the surface of the latter. The semiconductor substrate is made of a semiconductor material other than from a III–V compound and has its back and side faces previously coated with a stable material resistant to corrosive action of a hydrogen halide at any growing temperature. Since the epitaxial growth can be carried out at a temperature lower than that of the crystal $A_xB_{1-x}$ as mentioned above, and since it also suffices that a thin layer of crystal B covers the entire substrate surface, it is possible to use a hydrogen halide of low concentration. This prevents the generation of an alloy layer formed by the materials composing the substrate and crystal $A_xB_{1-x}$ and also minimizes the possibility of vapor etching of the substrate surface layer due to a hydrogen halide. After the crystal B has been grown to a desired extent, the substrate temperature is increased to the epitaxial temperature of the crystal $A_xB_{1-x}$ and the concentration of the hydrogen halide is increased so as to allow a continuous epitaxial growth of the crystal $A_xB_{1-x}$ of a desired thickness.

The superiority of the present invention is exhibited not only in arresting the generation of an alloy layer on the base and preventing autodoping from the base as stated above, but also in providing a far excellent mass-productivity as compared with the conventional methods in which the material must be removed from the furnace before the growth of the second layer (in the present invention, continuous growth can be performed in one growing process). Further, at the transition from the first to the second layer, the hetero-junction shows an extremely smooth and clear interface and hence, excellent crystallinity is obtained. Moreover, the entire system remains perfectly free of contamination by impurities throughout the operation.

The invention will now be described in detail by way of some preferred embodiments thereof with reference to the accompanying drawings. It should, however, be understood that the present invention is not limited to the particular embodiments shown herebelow but various changes and modifications can be made without departing from the spirit of the present invention.

IN THE DRAWINGS

FIG. 1 is a sectional view of a crystal growing apparatus used in practicing the process of the present invention; and FIG. 2 is a graph showing the temperature profile during crystal growth in the apparatus shown in FIG. 1.

DESCRIPTION OF THE PREFERRED EMBODIMENTS

Example 1

A $GaP_{0.4}As_{0.6}$ mixed crystal was epitaxially grown in the following manner on the surface of an n-type Ge substrate which had previously been coated over its back and side faces with about 1$\mu$ *m*-thick double films of $SiO_2$-Si by using a chemical vapor deposition method.

Figure 1:
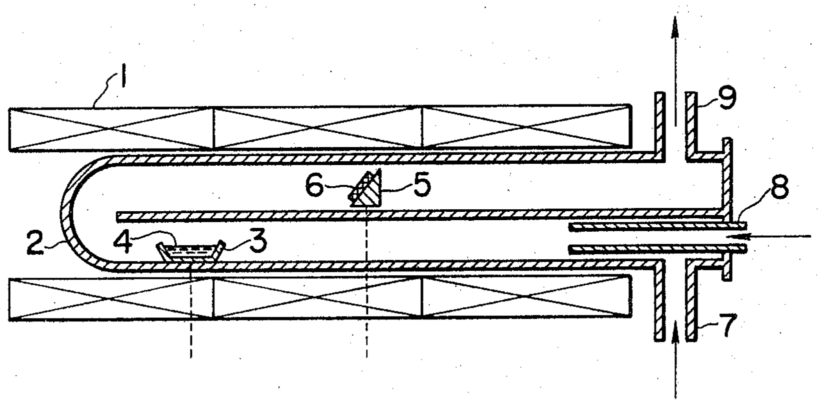
Figure 2:
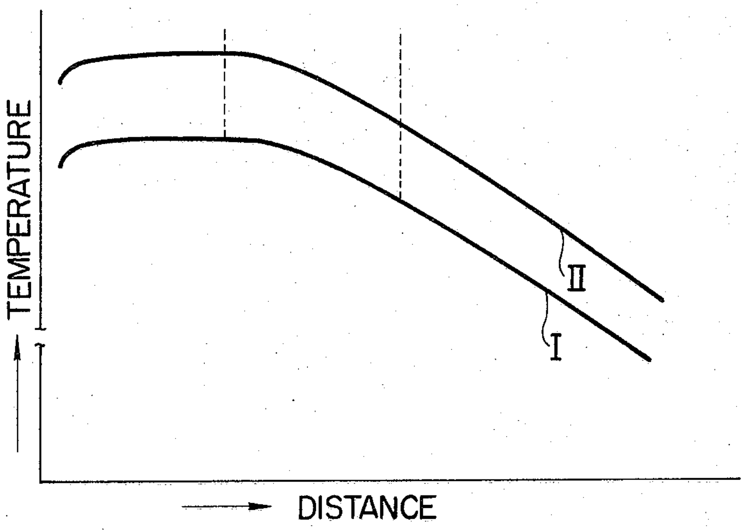

The substrate surface was mirror-polished and then subjected to etching with a 1:1 mixed solution of $H_2O_2$ and HF. The treated substrate (6) was then laid on a supporting block (5) and placed in a reaction tube (2) along with a 6-gram source material Ga (4) contained in a boat (3), as shown in FIG. 1. After perfectly substituting the gas in the reaction tube (2) with hydrogen, the temperature of the electric furnace (1) was gradually increased while feeding into the reaction tube (2) hydrogen at the rate of about 30 cc per minute from a gas inlet port (8) and at the same time hydrogen containing about 5% $AsH_3$ at the rate of about 100 cc per minute from another gas inlet port (7). The gases flowing into the reaction tube from the respective inlet ports (7) and (8) are exhausted from an outlet port (9). FIG. 2 shows the temperature profile during the crystal growth process in the apparatus shown in FIG. 1, where the horizontal axis represents the positions of the elements in the reaction tube (2) shown immediately above the graph and the vertical axis represents temperature.

Upon reaching a temperature profile shown by curve I in FIG. 2, the operation was stopped and the entire system was kept in a constant state for about 30 minutes. During this period, the temperature of the source Ga (4) was retained at about 850° C and that of the substrate Ge (6) at about 690° C.

Thereafter, hydrogen which had been passed through $AsCl_3$ solution kept at about 0° C in another container (not shown) to saturate $AsCl_3$ was introduced into the reaction tube (2) from the inlet port (8) at the rate of about 30 cc per minute, while hydrogen containing about 5% $AsH_3$ was also introduced simultaneously into the tube from the inlet port (7) at the rate of about 100 cc per minute. About 1 hour later, the flow of $AsCl_3$—containing hydrogen alone was stopped, while the flow of $AsH_3$—containing hydrogen was continued, and the temperature of the electric furnace (1) was further raised until a temperature distribution shown by curve II in FIG. 2 has been achieved. Upon reaching this temperature profile, the operation was again stopped and the reaction system was retained in the state as it was for about 10 minutes and, thereafter, $AsCl_3$—containing hydrogen kept at about 20° C was again fed into the reaction tube from the inlet port (8) at the rate of about 40 cc/min, while simultaneously feeding about 5% $PH_3$—containing hydrogen at a rate of about 80 cc/min and about 5% $AsH_3$—containing hydrogen at the rate of about 30 cc/min from the inlet port (7). During this period, the temperature of the source Ga (4) was kept at about 910° C and that of the substrate (6) at about 820° C. After about 5 hours, the flows of $AsCl_3$—, $PH_3$— and $AsH_3$—containing hydrogen fluids were stopped, followed immediately by introducing hydrogen from both inlets (7) and (8) at a rate of about 30 cc/min to lower the temperature in the reaction tube.

Consequently, it was confirmed by microscopic observation of a layer cross-section and X-ray microanalyzer tests that a GaAs layer, about 9$\mu$ *m*-thick, was formed on the base (6) and a mixed crystal layer of $GaP_{0.42}As_{0.58}$, about 140$\mu$ *m*-thick, on the GaAs layer.

Then, the entirety of the substrate and GaAs layer and a portion of the mixed crystal layer were ground away to form a specimen composed of the $GaP_{0.42}As_{0.58}$ layer alone. The periphery of this specimen was four-point alloyed with small particles of Sn-doped In to form an ohmic electrode and then the electrical properties thereof were determined by using Pauw's method. The carrier concentration in the grown layer at room temperature was about $4 \times 10^{15} cm^{-3}$ and the mobility was about 3,400 $cm^3$/V. sec. These results show that the autodoping from the Ge substrate had been supressed to an extent where the effect of such autodoping was almost negligible and, consequently, excellent crystallinity can be obtained. This is considered to be due to the fact that, since the growth of GaAs is carried out at a low temperature and at low hydrogen halide concentration, there is little chance for generation of an alloy layer on the Ge surface and for etching of the Ge substrate by HCl and, also, since Ge and GaAs have almost the same lattice constant, the possibility of the formation of crystal defects is minimized.

In another experiment, a mixed crystal of $GaP_{0.42}As_{0.58}$ was grown by following the same process as above except that Ga containing about 0.1 atomic percent of Te was used as the source (4). The resultant layer had a carrier concentration of about $2 \times 10^{17}$ $cm^{-3}$ and a mobility of about 2,300 $cm^3$/V.sec. After diffusing Zn in the grown layer, $0.5 \times 0.5$ $mm^2$ pellets were sliced off from the layer and assembled into a diode, to which a forward bias was applied, to emit light from the diode. Analysis of its emission spectrum revealed that this diode gives out red luminescence having its peak at about 6,450 A, and no other radiating band was observed in the visible and near infrared regions. Brightness at a current density of 8 A/$cm^2$ was about 600 fL.

Example 2

Two layers of GaSb and Ga (Sb, As) were epitaxially grown in by the same method as Example 1 on the Zn (111) surface of a *p*-type ZnTe single crystal substrate which had been coated with double films of $SiO_2$-Si over the back and side faces thereof. Namely, first the surface of the substrate was mirror-polished and then subjected to chemical etching with heated NaOH liquid. The treated substrate (6) was then placed in a reaction tube (2) together with about a 6-gram source Ga (4) containing about 0.8 gram of GaSb (undoped), as shown in FIG. 1. After sufficiently substituting the gas in the reaction tube (2) with hydrogen, the temperature of the electric furnace (1) was gradually increased while feeding into the reaction tube (2) hydrogen from the gas inlet port (7) at a rate of about 30 cc/min as well as about 5% $SbH_3$—containing hydrogen from another gas inlet port (8) at a rate of about 40 cc/min. When the temperature profile had just reached the curve I shown in FIG. 2, the system was maintained constant for about 30 minutes. During this period, the temperature of the source Ga (4) had been kept at about 850° C and that of the substrate (6) at about 600° C. Thereafter, $SbCl_5$—saturated hydrogen at about 20° C was introduced into the system from the inlet port (7) at the rate of about 50 cc/min while, at the same time, about 5% $SbH_3$—containing hydrogen was introduced into the tube from the inlet port (8) at the rate of about 50 cc/min. After continuing this operation for about one hour, the flow of $SbCl_5$—containing hydrogen alone was stopped, and the temperature of the electric furnace (1) was further raised while feeding about 5% $AsH_3$—containing hydrogen from the inlet port (7) at the rate of about 100 cc/min and about 5% $SbH_3$—containing hydrogen from the inlet port (8) at the rate of about 30 cc/min, until a temperature profile such as shown by curve II in FIG. 2 was attained. During this period, the temperature of the source Ga (4) has been kept at about 900° C and that of the substrate (6) at about 720° C. Upon reaching this temperature profile, the system was again kept constant for about 20 minutes and, thereafter, $AsCl_3$—saturated hydrogen kept at about 20° C was introduced into the system from the inlet port (7) at the rate of about 50 cc/min and at the same time $SbH_3$—containing hydrogen from the inlet port (8) at the rate of about 60 cc/min. After continuing this operation for about 5 hours, the temperature of the system was lowered by stopping the flow of $AsCl_3$—and $SbH_3$—containing hydrogen fluid and, instead, introducing hydrogen into the system from both inlet ports (7) and (8) at the rate of about 30 cc/min, respectively.

As a result, there were formed a GaSb layer about 5$\mu$ *m*-thick on the ZnTe substrate and a $GaSb_xAs_{1-x}$ about 70$\mu$ *m*-thick on the GaSb layer. Structural changes of this mixed crystal layer were examined by an X-ray microanalyzer, whereby it was found that the mixing ratio was gradually reduced from 1 until it finally became constant at about 0.33 after passing through the grading layer of about 10$\mu$ *m* in thickness. The interface of the hetero-junction was flat and smooth, as was the surface of the grown layer. The ZnTe substrate and the grading layer were removed by grinding and chemical etching, and then about 5% Sn—containing In was applied on the back face of the grown layer by vacuum evaporation to form an ohmic electrode, and an Au button was applied on the front face of the layer also by vacuum evaporation to make a Schottky barrier, and then the carrier concentration was examined. It was found, as a result, that the grown layer was of an N-type and the carrier concentration at room temperature was about $8 \times 10^{15} cm^{-3}$. These results indicate that autodoping of An or Te from the substrate is substantially negligible.

What we claim is:

1. A process for the epitaxial growth of a mixed semiconductor crystal of Group III–V compounds, comprising the steps of:

coating the back and side faces of a substrate, made of a semiconductor material other than the mixed III–V compound semiconductor crystal to be grown, with a silicon-containing material chemically stable against the corrosive action of a halogen or halides at the epitaxial temperature of said III–V compound semiconductor;

placing said substrate coated with said chemically stable material in a reaction tube in such a manner that the non-coated face of said substrate will be contacted with the reaction gas in said reaction tube;

heating said coated substrate placed in said reaction tube to the epitaxial growth temperature of one compound among said mixed crystal-composing compounds which has a lower epitaxial temperature than said mixed III–V compound crystal;

forming said compound on the non-coated face of said substrate by a disproportionation reaction according to a halogen vapor transport method;

heating said substrate placed in said reaction tube to the epitaxial temperature of the mixed Group III–V compound semiconductor crystal to be grown; and forming said mixed III–V compound semiconductor crystal on said compound by a disproportionation reaction according to a halogen vapor transport method.

2. An epitaxial growth process for mixed III–V compound semiconductor crystals according to claim 1, in which said chemically stable material is a double layer of $SiO_2$—Si.

3. An epitaxial growth process for mixed III–V compound semiconductor crystals according to claim 1, in which said substrate is made of Ge, the compound formed on the non-coated face of said substrate is GaAs, and said III–V compound semiconductor is GaPAs.

4. An epitaxial growth process for mixed III–V compound semiconductor crystals according to claim 1, in which said substrate is made of ZnTe, the compound to be formed on the non-coated face of said substrate is GaSb, and said III–V compound semiconductor is GaSbAs.

5. A process for the epitaxial growth of a mixed semiconductor crystal of Group III–V compounds, comprising the steps of:

a. providing a substrate made of a semiconductor material exclusive of the materials to be included in the mixed semiconductor material to be epitaxially grown;

b. coating each surface of said substrate, except the surface on which epitaxial growth is to be carried out, with a silicon containing material which is chemically impervious to corrosion by a halogen or halides at the epitaxial temperature of a Group III–V compound semiconductor;

c. disposing said coated substrate in a reaction chamber, into which at least one reaction gas is to be introduced, so that the surface on which epitaxial growth is to be carried out will be exposed to said at least one reaction gas introduced into said chamber;

d. disposing, in said reaction chamber, a source material containing a first component of a III–V compound and a mixed III–V compound semiconductor crystal to be epitaxially grown;

e. increasing the temperature within said reaction chamber, while introducing a first gas into said chamber, containing a second component of a III–V compound to be epitaxially grown, to the epitaxial growth temperature of the III–V compound to be grown, which has a lower epitaxial growth temperature than the epitaxial temperature of the mixed Group III–V compound semiconductor crystal to be epitaxially grown;

f. introducing a second gas into said chamber, containing a halogen containing compound of said second component, to form a first III–V compound, containing said first and second components, on said exposed surface of said substrate;

g. heating said substrate, on which said first III–V compound has been epitaxially grown, to the epitaxial growth temperature of the mixed Group III–V compound semiconductor crystal to be epitaxially grown; and h. introducing a third gas into said chamber containing at least one compound of a second component of said mixed crystal including a halogen containing compound of the second component of said mixed crystal and a third component of the mixed crystal, to form a mixed Group III–V semiconductor crystal on said epitaxially grown III–V compound.

6. A process according to claim 5, wherein step (*e*) further includes the steps of maintaining the conditions within said chamber constant by holding the temperature within said chamber constant at said lower epitaxial growth temperature for a predetermined period of time.

7. A process according to claim 5, wherein step (*g*) further includes the steps of maintaining the conditions within said chamber constant holding the temperature within said chamber constant at the epitaxial growth temperature of the mixed Group III–V compound semiconductor crystal, for a prescribed period of time.

8. A process according to claim 6, wherein step (*g*) further includes the steps of maintaining the conditions within said chamber constant holding the temperature within said chamber constant at the epitaxial growth temperature of the mixed Group III–V compound semiconductor crystal, for a prescribed period of time.

9. A process according to claim 5, wherein said second component consists of a material selected from the group consisting of arsenic and antimony.

10. A process according to claim 5, wherein said first component is gallium and said second component consists of a material selected from the group consisting of arsenic and antimony.

11. A process according to claim 5, wherein said second component is arsenic and said third component is phosphorous.

12. A process according to claim 5, wherein said first gas comprises hydrogen containing a specified percentage of a material selected from the group consisting of $AsH_3$ and $SbH_3$.

13. A process according to claim 12, wherein said second gas includes a chloride of an element selected from the group consisting of As and Sb.

14. A process according to claim 13, wherein said second gas further includes hydrogen containing a specified percentage of a material selected from the group consisting of $AsH_3$ and $SbH_3$.

15. A process according to claim 14, wherein said third gas includes hydrogen containing specified percentages of at least two compounds selected from the group consisting of $AsCl_3$, $AsH_3$, $SbH_3$ and $PH_3$.

16. A process according to claim 5, further including the step (*i*) of stopping the introduction of said third gas, and cooling said chamber by introducing a fourth gas absent said components into said chamber.

17. A process according to claim 5, wherein said substrate consists of a material selected from the group consisting of germanium and a ZnTe single crystal.

18. A process according to claim 17, wherein said source material consists of a material selected from the group consisting of gallium, gallium containing a prescribed amount of GaSb, and gallium containing a prescribed amount of tellurium.

19. A process according to claim 8, wherein said substrate consists of germanium, said source material consists of a material selected from the group consisting of gallium and gallium containing a prescribed amount of tellurium, said first gas includes $AsH_3$, said second gas includes $AsCl_3$ and $AsH_3$, said third gas includes $AsCl_3$, $PH_3$ and $AsH_3$, said predetermined period of time is about 30 minutes and said prescribed period of time is about 10 minutes.

20. A process according to claim 8, wherein said substrate consists of ZnTe, said source material consists of gallium containing GaSb, said first gas includes $SbH_3$, said second gas includes $SbCl_5$ and $SbH_3$, said third gas includes $AsCl_3$ and $SbH_3$, said predetermined period of time is about 30 minutes and said prescribed period of time is about 20 minutes.

21. A process according to claim 5, wherein said step (*f*) further includes the step of stopping the introduction of the halogen containing compound while introducing a gas containing a compound of said second component.

22. A process according to claim 8, wherein said step (*f*) further includes the step of stopping the introduction of the halogen containing compound while introducing a gas containing a compound of said second component.

23. A process according to claim 1, wherein said substrate is a semiconductor material including Group IV element semiconductors and II–VI compound semiconductors.

24. A process according to claim 1, wherein said silicon-containing material includes silicon and silicon oxide.

* * * * *